United States Patent [19]
Leach et al.

[11] Patent Number: 5,923,615
[45] Date of Patent: Jul. 13, 1999

[54] SYNCHRONOUS PIPELINED BURST MEMORY AND METHOD FOR OPERATING SAME

[75] Inventors: Derrick Andrew Leach; Donovan Scott Popps; Frank Arlen Miller, all of Austin, Tex.

[73] Assignee: Motorlola, Schaumburg, Ill.

[21] Appl. No.: 09/061,953

[22] Filed: Apr. 17, 1998

[51] Int. Cl.[6] .................................................. G11C 7/00
[52] U.S. Cl. ....................................... 365/238.5; 365/233
[58] Field of Search .................................. 365/233, 238.5, 365/239, 240

[56] References Cited

U.S. PATENT DOCUMENTS

| | | | |
|---|---|---|---|
| 4,799,199 | 1/1989 | Scales, III et al. | 365/230 |
| 5,402,389 | 3/1995 | Flannagan et al. | 365/233 |
| 5,781,499 | 7/1998 | Koshikawa | 365/233 |
| 5,808,958 | 9/1998 | Vogley et al. | 365/233 |
| 5,845,108 | 12/1998 | Yoo et al. | 365/233 |

OTHER PUBLICATIONS

Joseph C. Circello, "E2000 Series CPU Hardware Reference Manual", Edgcore Technology, Inc., Sep. 1989, Section 9. E2000 Central Processor Unit Partition, pp. 26–32.

Motorola, Inc. Mar. 16, 1998 Semiconductor Technical Data, "Advance Information 64K × 36 Bit Pipelined BurstRAM Synchronous Fast Static RAM", MCM63P636, pp. 1–26.

*Primary Examiner*—Vu A. Le
*Attorney, Agent, or Firm*—Paul J. Polansky

[57] ABSTRACT

A synchronous pipelined burst memory (20) achieves high speed by violating conventional pipelining rules. The memory (20) includes an address register (24) which latches a burst address during a first cycle of a periodic clock signal. The burst address is driven to an input of an asynchronous memory core (40), but output data from the asynchronous memory core (40) is not latched until a third cycle of the periodic clock signal which occurs after a second cycle of the periodic clock signal which is immediately subsequent to the first cycle. The memory (20) outputs successive data elements of the burst during consecutive cycles of the periodic clock signal to complete the burst cycle.

12 Claims, 2 Drawing Sheets

SYNCHRONOUS PIPELINED BURST MEMORY AND METHOD FOR OPERATING SAME

FIELD OF THE INVENTION

This invention relates generally to integrated circuit memories, and more particularly, to synchronous integrated circuit memories which can provide data in bursts.

BACKGROUND OF THE INVENTION

High-speed memories, especially high-speed static random access memories (SRAMs), are important in desktop computing and communications applications. A typical use for such memories is for a cache for a data processor. A cache is a relatively high-speed memory which contains a local copy of data located in a larger but slower main memory. The cache improves system performance because once the data processor accesses a data element at a particular address, there is a high probability it will access data elements at adjacent addresses. Making the cache memory as fast as possible improves system performance because data processors are also capable of operating at very high speed.

One technique to speed up cache accesses is the use of burst cycles. During a burst cycle, the data processor fetches data from a series of memory locations which are either consecutive or are clustered about the access address in modulo fashion. During the initial access of the burst, the data processor presents the burst address to the memory. The memory activates a word line selected by the burst address and keeps the word line active throughout the burst. All memory cells located along the activated word line provide differential voltages to corresponding bit line pairs. A column decoder selects a subset of the bit line pairs corresponding to the data element selected in that portion of the burst. Differential voltages developed between the selected bit line pairs are then sensed and amplified before final output. In subsequent cycles, other subsets of the bit line pairs corresponding to other data elements in the burst are selected. Since the address decoding, word line selection and driving, and bit line differentiation have already taken place, the subsequent cycles of the burst are faster.

A second technique that has become popular is to make these memories synchronous with the data processor's clock signal. Since the data processor accesses data from the bus synchronously, the memory can take advantage of the available clock signals to control its internal operation.

A third technique, which is applicable to synchronous memories, is pipelining. Pipelining breaks down a complex task into a series of smaller sub-tasks. Each sub-task is performed by an asynchronous circuit. Between each asynchronous circuit is a pipeline register which captures the output of the previous pipeline stage for presentation to the next stage in synchronism with a clock periodic signal. Pipelining allows different sub-tasks of several operations to be performed in parallel, increasing performance.

For example in the data processor field, which uses pipelining extensively, the execution of a program instruction can be implemented in a five-stage pipeline which includes instruction fetch, instruction decode, operand fetch, execution, and writeback stages. Performance is increased in this five-stage pipeline example because while one instruction is being written back, a second instruction can be executed, a third instruction can perform operand fetch, and so on.

Pipelining has also been applied to synchronous burst memory devices because a burst access can be conveniently broken down into overlapping sub-tasks. For example, a known synchronous memory pipeline includes an address input stage, an address predecoding stage, an array access stage, and a data output stage. In conformity with pipelining rules, this memory includes a register between each stage for a total of three registers. When such a memory receives a burst access which requests four data elements, the first access takes four cycles between address input and data output, but due to the pipelining feature subsequent accesses take one cycle each. Hence this memory is designated a "4-1-1-1" memory.

As time goes on, however, data processors are being clocked by faster and faster clocks, making it more difficult for conventional pipelined memories to propagate all signals through each stage of the pipeline without breaking up the circuitry further and adding more pipeline stages. What is needed, then, is a synchronous pipelined burst memory which is able to operate with faster clock speeds without adding extra depth to the pipeline. Such a memory is provided by the present invention, whose features and advantages will be more clearly understood from the following detailed description taken in conjunction with the accompanying drawings.

DETAILED DESCRIPTION OF A PREFERRED EMBODIMENT

Figure 1:
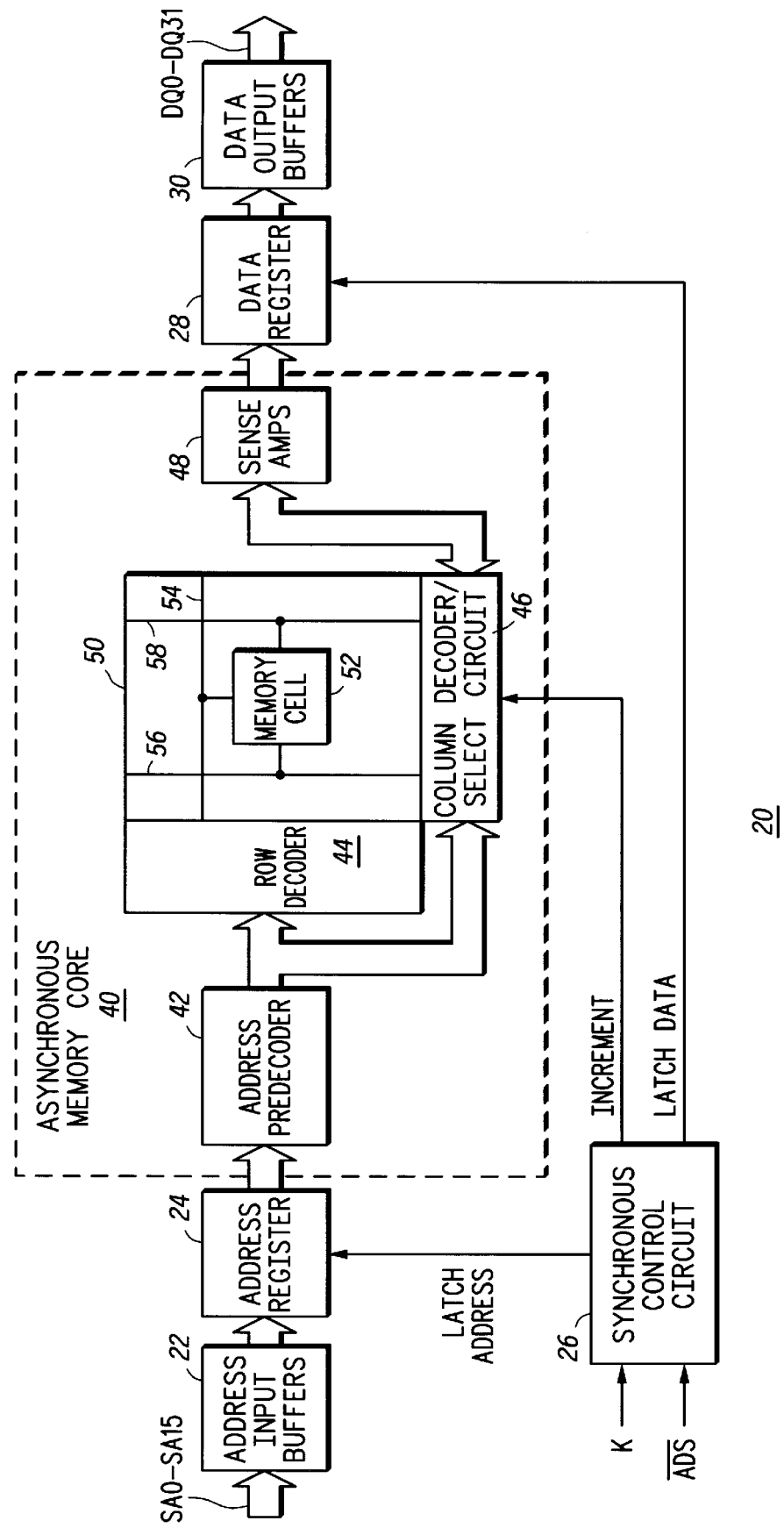
FIG. 1 illustrates in block diagram form a high-speed synchronous pipelined burst static random access memory (SRAM) according to the present invention.

FIG. 1 illustrates in block diagram form a synchronous pipelined burst memory 20 according to the present invention. Memory 20 includes generally address input buffers 22, an address register 24, a synchronous control circuit 26, a data register 28, data output buffers 30, and an asynchronous memory core 40. Address input buffers 22 have an input terminal for receiving a 16-bit input address signal labelled "SA0–SA15" via corresponding integrated circuit bonding pads, and an output terminal for providing a buffered address signal. Address register 24 has an input terminal connected to the output terminal of address input buffers 22, a control input terminal for receiving a signal labelled "LATCH ADDRESS", and an output terminal connected to an input terminal of asynchronous memory core 40. Synchronous control circuit 26 has a first input terminal for receiving a periodic clock signal labelled "K", a second input terminal for receiving an address status control signal labelled " $\overline{\text{ADS}}$", a first output terminal for providing the LATCH ADDRESS signal, a second output terminal for providing a signal labelled "INCREMENT", and a third output terminal for providing a signal labelled "LATCH DATA". Data register 28 has an input terminal connected to an output terminal of asynchronous memory core 40, a control input terminal for receiving the LATCH DATA signal, and an output terminal. Data output buffers 30 have an input terminal connected to the output terminal of data register 28, and an output terminal for providing a 32-bit data signal labelled "DQ0–DQ31" to corresponding integrated circuit bonding pads.

Asynchronous memory core 40 includes an address predecoder 42, a row decoder 44, a column decoder/select circuit 46, sense amplifiers (amps) 48, and a memory array 50. Address predecoder 42 has an input terminal connected to the output terminal of address register 24, and an output terminal. Row decoder 44 has an input terminal connected to the output terminal of address predecoder 42, and an output terminal connected to memory array 50. Column decoder/select circuit 46 has an address input terminal connected to the output terminal of address predecoder 42, a control input terminal for receiving the INCREMENT signal, a first data terminal connected to memory array 50, and a second data terminal. Sense amps 48 have an input terminal connected to the second data terminal of column decoder/select circuit 46, and an output terminal connected to the input terminal of data register 28.

Figure 2:
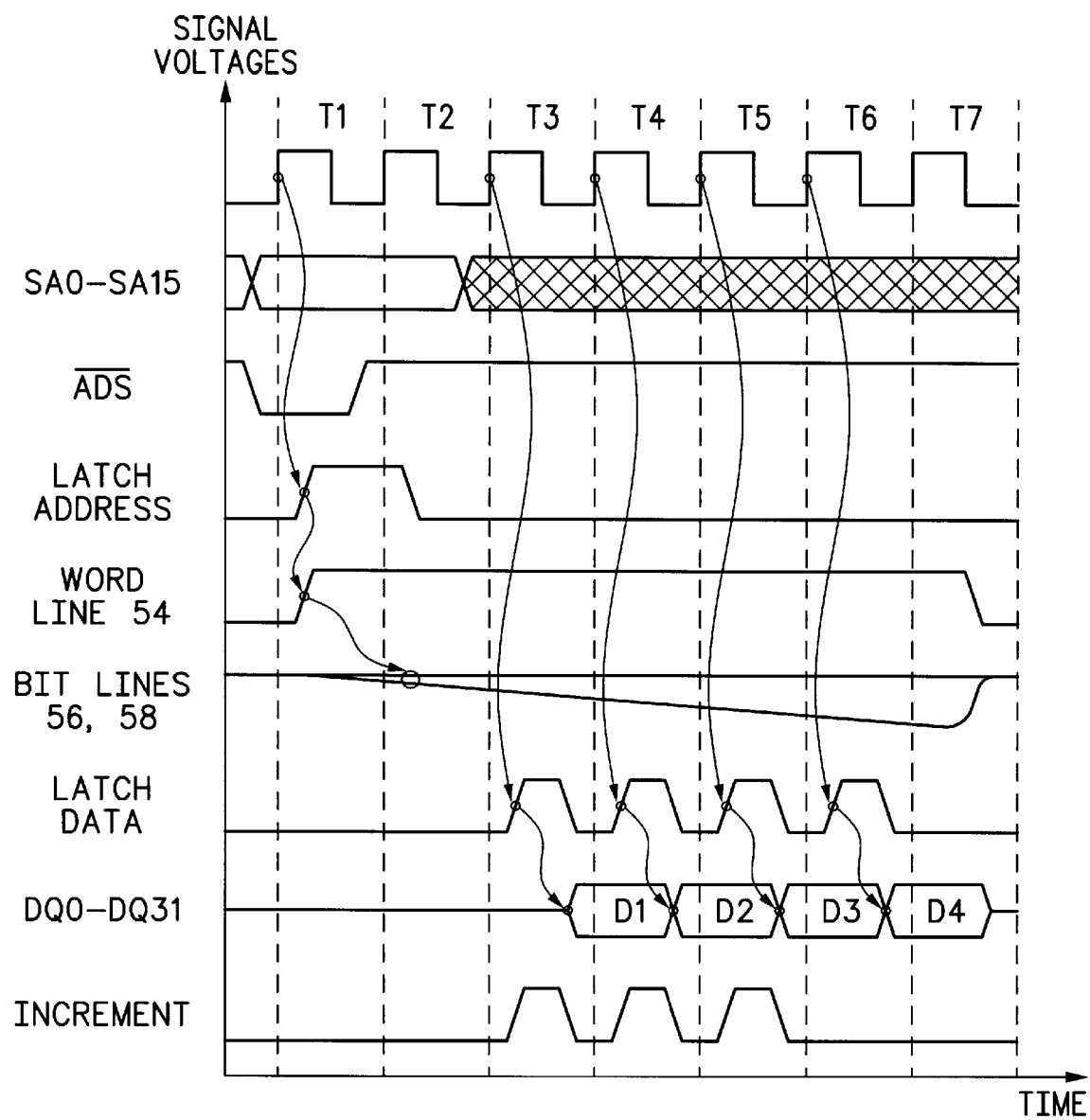
FIG. 2 illustrates a timing diagram of the memory of FIG. 1.

Memory array 50 is a high-speed static random access memory (SRAM) array including a matrix of word lines crossing bit line pairs, with each memory cell located at an intersection of a word line and a bit line pair. Shown in FIG. 2 is a representative memory cell 52 connected to a word line 54 and a bit line pair formed by bit lines 56 and 58. Preferably, memory array 50 is not a single array but is actually a set of arrays segmented into quadrants with multiple sub-blocks within each quadrants. However the particular density of memory 20 and the organization of memory array 50 into smaller sub-arrays, quadrants, blocks, etc. is not important to the present invention and will not be discussed further.

In general operation, asynchronous memory core 40 functions similarly to a single-chip asynchronous SRAM. In response to an access cycle, asynchronous memory core 40 decodes the address in two parts. The first part is performed by address predecoder 42. Address predecoder 42 receives the buffered address stored in address register 24 and generates a set of predecoded signals, some of which are input to row decoder 44 and others of which are input to column decoder/select circuit 46. The signals relevant to row decoding (in the selected architecture) are input to row decoder 44, which activates a single word line. For example in response to an activation of word line 54, memory cell 52 drives a differential voltage between bit lines 56 and 58 representative of the logic state stored therein. The differential voltage is relatively small and the bit lines must achieve a certain amount of separation in voltage before sense amps 48 can accurately sense the logic state of memory cell 52. In response to the INCREMENT signal, column decoder/select circuit 46 increments the column address according to a predetermined incrementing scheme (such as modulo) to yield successive data elements along the row corresponding to word line 54.

Memory 20 is pipelined in order to improve performance. Address signals SA0–SA15 are set up to the low-to-high transition of signal K at the input of address input buffers 22. This input address is latched into address register 24 in response to the LATCH ADDRESS signal. Synchronous control circuit 26 activates the LATCH ADDRESS signal during a first clock period, at a delay time after a low-to-high transition of signal K when input signal $\overline{ADS}$ is active. Thus input address SA0–SA15 represents a burst address driven to asynchronous memory core 40.

In response, asynchronous memory core 40 performs address predecoding and row and column decoding to select a single word of data at the selected address. Column decoder/select circuit 46 connects selected bit lines to sense amps 48. These bit lines develop a small differential voltage between them to indicate the logic states of the accessed memory cells. Sense amps 48 then sense and amplify this small differential voltage to provide a large single-ended voltage at the output terminal thereof.

The operating speed of a conventional pipelined burst memory device is limited by the delay through asynchronous memory core 40. If clock signal K exceeded a certain frequency, its period would be so short that the signals propagating through it would not be valid at the output before the next K cycle. The conventional solution to this problem would be to add an extra pipeline register to divide the circuitry in asynchronous memory core 40 into two smaller sub-circuits. This approach would add an extra cycle to the access and an extra register.

According to the present invention, however, memory 20 solves this problem by violating conventional pipelining rules. Memory 20 activates the LATCH ADDRESS signal during a first K cycle, but does not activate the LATCH DATA signal during a second, immediately subsequent K cycle. Synchronous control circuit 26 only activates the LATCH DATA signal during a third K cycle which is either the next K cycle or some subsequent K cycle.

The timing of these events is better understood with reference to FIG. 2, which illustrates a timing diagram of memory 20 of FIG. 1. In FIG. 2 the horizontal axis represents time, and the vertical axis voltage of various signals. Memory 20 uses the low-to-high transition of signal K, which is a periodic clock signal, to synchronize internal events. K is typically a bus clock signal which has a frequency which is some fraction of the data processor's internal clock frequency. Depicted in FIG. 2 are seven complete cycles of the K clock, designated "T1", "T2", etc., and measured between successive low-to-high transitions of the K clock. A low-to-high transition of T1 is designated the "rising edge" of T1.

The data processor starts a burst access by placing a valid address on signal lines SA0–SA15 and activating control signal $\overline{ADS}$. As shown in FIG. 2, the data processor activates these signals during the K clock cycle immediately prior to the rising edge of the next K clock cycle, labelled "T1".

In response to the activation of signal $\overline{ADS}$ at the rising edge of T1, synchronous control circuit 26 activates the LATCH ADDRESS signal to latch SA0–SA15 in address register 24. In response to this new address being output by address register 24, address predecoder 42 and row decoder 44 together perform a row decoding function, which results in the activation of a word line such as word line 54. The activation of word line 54 results in all memory cells located thereon differentiating the bit lines (which had been previously precharged and equalized) based on the logic state of the bit stored in the corresponding memory cells on word line 54. The bit lines differentiate relatively slowly, but eventually have a large enough differential therebetween to be accurately sensed and amplified. Address predecoder 42 and column decoder/select circuit 46 together perform a column decoding function, and initially select the first data element of the burst cycle.

Synchronous control circuit 26 activates the LATCH DATA signal at the rising edge of T3, and memory 20 outputs the accessed data a delay time thereafter. Note that synchronous control circuit 26 does not activate any pipeline register at the rising edge of T2.

Subsequent accesses of the burst proceed as follows. At the rising edge of T3 synchronous control circuit 26 activates the INCREMENT signal to column decoder/select circuit 46. In response to receiving the INCREMENT signal, column decoder/select circuit 46 changes the column address to select the next data element of the burst. The row address is not affected. Sensing of this data takes place during the remainder of T3. By the rising edge of T4, this data is valid at the input of data register 28 and synchronous control circuit 26 causes this data to be latched in data register 28 on this clock edge. This data element is then valid on the external pins a delay time thereafter, and may be latched by the data processor on the rising edge of T5. Subsequent accesses of the burst proceed in like fashion.

Memory 20 takes advantage of the fact that the time from the start of word line activation to sufficient bit line differentiation is not suited to additional pipelining. Furthermore, it takes a significant amount of time to activate the word lines and differentiate the bit lines, since these signal lines are long and have large capacitances. By violating conventional pipelining rules, the word line activation can begin during the first cycle (T2), allowing the selected memory cells more than one cycle to differentiate the bit lines to which they are connected. The sensing will be more robust because memory 20 allows more time to increase bit line differential than if the output of address predecoder 42 was latched.

While the invention has been described in the context of a preferred embodiment, it will be apparent to those skilled in the art that the present invention may be modified in numerous ways and may assume many embodiments other than that specifically set out and described above. For example the pipelining technique is applicable to any type of memory which can respond to burst cycles, including SRAMs, dynamic random access memories (DRAMs), read-only memories (ROMs), programmable ROMs (PROMs), erasable PROMs (EPROMs), electrically erasable PROMs (EEPROMs), block erasable (flash) EEPROMs, etc. Also a memory according to the present invention may support other types of bursts besides 4-1-1-1. Furthermore while memory 20 only performs burst accesses, the pipelining technique can be used in memories which also perform single-cycle accesses. Accordingly, it is intended by the appended claims to cover all modifications of the invention which fall within the true scope of the invention.

We claim:

1. A synchronous pipelined burst memory comprising:
   an address register having an input terminal for receiving a burst address, an output terminal, and a control input terminal;
   an asynchronous memory core having an address input terminal coupled to said output terminal of said address register, and an output terminal for providing in sequence a first data element and a second data element in response to said burst address;
   a data register having an input terminal coupled to an output terminal of said memory core, an output terminal coupled to an output terminal of the memory, and a control input terminal; and
   a synchronous control circuit having a first input terminal for receiving a periodic clock signal, a second input terminal for receiving a burst address control signal, a first output terminal coupled to said control input terminal of said address register for providing a first control signal thereto, and a second output terminal coupled to said control input terminal of said data register for providing a second control signal thereto, wherein in response to an activation of said burst address control signal, said synchronous control circuit activates said first control signal during a first cycle of said periodic clock signal, and activates said second control signal during a second cycle of said periodic clock signal subsequent to said first cycle by at least one cycle of said periodic clock signal.

2. The memory of claim 1 wherein said memory core provides said first data element during said second cycle and said second data element during a third cycle of said periodic clock signal immediately subsequent to said second cycle.

3. The memory of claim 2 wherein said synchronous control circuit activates said second control signal during both said second cycle and said third cycle.

4. The memory of claim 3 wherein said memory core provides a third data element during a fourth cycle of said periodic clock signal immediately subsequent to said third cycle, and provides a fourth data element during a fifth cycle of said periodic clock signal immediately subsequent to said fourth cycle, and wherein said synchronous control circuit activates said second control signal during both said fourth cycle and said fifth cycle.

5. The memory of claim 1 wherein said memory core comprises:
   a memory array having a plurality of word lines, a plurality of bit line pairs, and a plurality of memory cells located at intersections of each of said plurality of word lines and each of said plurality of bit line pairs;
   row decoder means coupled to said address register and to said memory array for activating one of said plurality of word lines as determined by said burst address;
   column decoder means coupled to said address register and to said memory array for providing differential voltages representative of bits of said first data element and said second data element by selecting corresponding portions of memory cells located on a selected one of said plurality of word lines; and
   sense amplifier means coupled to said column decoder means and to said data register for sensing said first data element and said second data element by amplifying said differential voltages and providing corresponding amplified voltages to said data register.

6. An integrated circuit synchronous pipelined burst memory comprising:
   a plurality of address input buffers each having an input terminal coupled to a corresponding one of a plurality of address input terminals, and an output terminal, said plurality of address input buffers receiving a burst address;
   an address register having an input terminal coupled to said output terminal of each of said plurality of address input buffers, an output terminal, and a control input terminal;
   an asynchronous memory core having an address input terminal coupled to said output terminal of said address register, and an output terminal for providing in sequence a first data element and a second data element in response to said burst address;
   a data register having an input terminal coupled to an output terminal of said memory core, an output terminal, and a control input terminal;
   a plurality of data output buffers each having an input terminal coupled to said output terminal of said data register, and an output terminal coupled to a corresponding one of a plurality of data output terminals; and
   a synchronous control circuit having a first input terminal for receiving a periodic clock signal, a second input terminal for receiving a burst address control signal, a first output terminal coupled to said control input terminal of said address register for providing a first control signal thereto, and a second output terminal coupled to said control input terminal of said data register for providing a second control signal thereto, wherein in response to an activation of said burst address control signal, said synchronous control circuit activates said first control signal during a first cycle of said periodic clock signal, and activates said second control signal during a second cycle of said periodic clock signal subsequent to said first cycle by at least one cycle of said periodic clock signal.

7. The memory of claim 6 wherein said memory core provides said first data element during said second cycle and said second data element during a third cycle of said periodic clock signal immediately subsequent to said second cycle.

8. The memory of claim 7 wherein said synchronous control circuit activates said second control signal during both said second cycle and said third cycle.

9. The memory of claim 7 wherein said memory core provides a third data element during a fourth cycle of said periodic clock signal immediately subsequent to said third cycle, and provides a fourth data element during a fifth cycle of said periodic clock signal immediately subsequent to said fourth cycle, and wherein said synchronous control circuit activates said second control signal during both said fourth cycle and said fifth cycle.

10. The memory of claim 6 wherein said memory core comprises:
   a memory array having a plurality of word lines, a plurality of bit line pairs, and a plurality of memory cells located at intersections of each of said plurality of word lines and each of said plurality of bit line pairs;
   row decoder means coupled to said address register and to said memory array for activating one of said plurality of word lines as determined by said burst address;
   column decoder means coupled to said address register and to said memory array for providing differential voltages representative of bits of said first data element and said second data element by selecting corresponding portions of memory cells located on a selected one of said plurality of word lines; and
   sense amplifier means coupled to said column decoder means and to said data register for sensing said first data element and said second data element by amplifying said differential voltages and providing corresponding amplified voltages to said data register.

11. A method for operating a synchronous pipelined burst memory comprising the steps of:
   detecting a burst access to the synchronous pipelined burst memory;
   latching a burst address in an address register in response to a predetermined transition of a periodic clock signal during a first cycle of said periodic clock signal;
   selecting in sequence a first data element and a second data element in response to said burst address by inputting said burst address at an input of an asynchronous memory core;
   latching said first data element in a data register at an output of said asynchronous memory core in response to said predetermined transition of said periodic clock signal during a second cycle of said periodic clock signal separated from said first cycle by at least one cycle;
   outputting said first data element;
   latching said second data element in said data register in response to said predetermined transition of said periodic clock signal during a third cycle of said periodic clock signal immediately subsequent to said second cycle; and
   outputting said second data element.

12. The method of claim 11 further comprising the steps of:
   selecting third and fourth data elements in response to said burst address;
   latching said third data element in said data register in response to said predetermined transition of said periodic clock signal during a fourth cycle of said periodic clock signal immediately subsequent to said third cycle by at least one cycle;
   outputting said third data element;
   latching said fourth data element in said data register in response to said predetermined transition of said periodic clock signal during a fifth cycle of said periodic clock signal immediately subsequent to said fourth cycle; and
   outputting said fourth data element.

\* \* \* \* \*